United States Patent [19]

Van Beneden et al.

[11] Patent Number: 5,867,895
[45] Date of Patent: Feb. 9, 1999

[54] METHOD OF MOUNTING AN ELECTRICAL COMPONENT WITH SURFACE-MOUNTABLE TERMINALS

[75] Inventors: Bruno Van Beneden, Zellik; Henri L. P. Lorrain, Brussels, both of Belgium

[73] Assignee: U.S. Philips Corporation, New York, N.Y.

[21] Appl. No.: 673,831

[22] Filed: Jun. 27, 1996

[30] Foreign Application Priority Data

Jun. 30, 1995 [EP] European Pat. Off. .............. 95201787

[51] Int. Cl.$^6$ ........................... H01R 43/16; H05K 13/04
[52] U.S. Cl. ................................ 29/827; 29/854; 29/879; 29/884; 228/179.1; 257/676; 361/813
[58] Field of Search .............................. 29/827, 854, 879, 29/884; 216/14; 228/179.1; 257/668, 676, 677; 361/306.1, 813

[56] References Cited

U.S. PATENT DOCUMENTS

| | | | |
|---|---|---|---|
| 4,497,012 | 1/1985 | Gottlieb et al. | 361/306.2 |
| 4,785,533 | 11/1988 | Seino et al. | 29/827 |
| 4,989,318 | 2/1991 | Utunomiya et al. | 29/827 X |
| 5,060,117 | 10/1991 | Dorlanne et al. | 361/813 |
| 5,307,929 | 5/1994 | Seidler | 29/884 X |

FOREIGN PATENT DOCUMENTS 2-281610  11/1990  Japan ...................... 29/827

*Primary Examiner*—Peter Vo
*Attorney, Agent, or Firm*—Daniel E. Tierney

[57] ABSTRACT

A method of providing an electrical component with surface-mountable metallic terminals, the component comprising two substantially parallel faces ($S_1$, $S_2$) with which electrical contact can be made, the perpendicular separation of these faces ($S_1$, $S_2$) having a value t, which method comprises the following steps:

(a) Providing a substantially planar lead-frame in which an open area is framed by metallic strips, the open area containing a first peninsular protrusion and a second peninsular protrusion which emerge from oppositely located strips, the first protrusion emerging as a stub and then bifurcating into two arms, the second protrusion emerging as a stub and then continuing as a single arm which extends between the two arms of the first protrusion;

(b) Bending a step into the second protrusion, so that part of its stub remains within the plane $P_0$ of the strips but that part of its single arm is displaced into a plane $P_2$ substantially parallel to $P_0$;

(c) Bending a step into the first protrusion, so that part of its stub remains within the plane $P_0$ of the strips but that part of each of the two arms is displaced into a plane $P_1$ substantially parallel to $P_0$, whereby $P_2$ is located between $P_0$ and $P_1$ and the perpendicular separation of $P_1$ and $P_2$ is approximately equal to t;

(d) Fixing the component between the planes $P_1$ and $P_2$ so that the two arms of the first protrusion are affixed to face $S_1$ and the single arm of the second protrusion is affixed to face $S_2$;

(e) Cutting the stubs of each of the protrusions away from the adjoining strips.

7 Claims, 2 Drawing Sheets

METHOD OF MOUNTING AN ELECTRICAL COMPONENT WITH SURFACE-MOUNTABLE TERMINALS

BACKGROUND OF THE INVENTION

The invention relates to a method of providing an electrical component with surface-mountable metallic terminals, the component comprising two substantially parallel faces, $S_1$ and $S_2$, with which electrical contact can be made, the perpendicular separation of these faces having a value t.

The invention also relates to an electrical component comprising two substantially parallel faces, $S_1$ and $S_2$, to each of which a surface-mountable electrical terminal is affixed. In particular, the invention relates to the case where such a component is a ceramic resistor having a positive Temperature Coefficient of Resistivity (so-called PTC resistor).

The invention further relates to a lead-frame suitable for use in the inventive method.

In a known method as stated in the opening paragraph, an edge of the electrical component is glued to the surface of a printed circuit board (PCB) in such a manner that the faces $S_1$, $S_2$ extend substantially perpendicular to the plane of the PCB. A blob of solder is then deposited on each of the faces $S_1$, $S_2$ at its juncture with the PCB, so as to connect each face to an adjacent metal land on the PCB; in this manner, the solder blobs act as bridges between the (vertical) faces $S_1$, $S_2$ and the corresponding (horizontal) lands, and effectively form the component's metallic terminals.

A disadvantage of this known method is that, in the case of an electrical component which can become warm (e.g. a PTC resistor), gluing the component to the PCB surface results in intimate thermal contact with the PCB, which is undesirable. Moreover, the immediate area of the PCB onto which the component is glued must be kept free of conductive tracks and lands, so that subsequent placement of the component thereupon will not entail an attendant risk of short-circuiting.

SUMMARY OF THE INVENTION

It is an object of the invention to provide an alternative method of surface-mounting an electrical component. In particular, it is an object of the invention that this method should result in relatively good thermal isolation of the surface-mounted component. Moreover, it is an object of the invention that the new method should allow the surface-mounted component to bridge conductive tracks on an underlying PCB, without the risk of a short-circuit.

These and other objects of the invention are achieved in a method as specified in the opening paragraph, characterised in that it comprises the following steps:

(a) Providing a substantially planar lead-frame in which an open area is framed by metallic strips, the open area containing a first and a second peninsular protrusion which emerge from oppositely located strips, the first protrusion emerging as a stub and then bifurcating into two arms, the second protrusion emerging as a stub and then continuing as a single arm which extends between the two arms of the first protrusion;

(b) Bending a step into the second protrusion, so that part of its stub remains within the plane $P_0$ of the strips but that part of its single arm is displaced into a plane $P_2$ substantially parallel to $P_1$;

(c) Bending a step into the first protrusion, so that part of its stub remains within the plane $P_0$ of the strips but that part of each of the two arms is displaced into a plane $P_1$ substantially parallel to $P_0$, whereby $P_2$ is located between $P_0$ and $P_1$ and the perpendicular separation of $P_1$ and $P_2$ is approximately equal to t;

(d) Fixing the component between the planes $P_1$ and $P_2$ so that the two arms of the first protrusion are affixed to face $S_1$ and the single arm of the second protrusion is affixed to face $S_2$;

(e) Cutting the stubs of each of the protrusions away from the adjoining strips.

After enaction of step (e) of the inventive method, the resulting component can be surface-mounted on a PCB by soldering its two stubs to corresponding lands on the PCB. Since the plane $P_0$ of the stubs is remote from the component, there will be an intervening empty space between the lower face $S_2$ of the surface-mounted component and the underlying surface of the PCB; this not only facilitates heat dissipation from the component, but also allows it to bridge underlying conductive tracks on the PCB without the attendant occurrence of a short circuit. In addition, the component does not have to be surface-mounted with the aid of glue. Moreover, the combination of a bifurcated arm on the top-side of the component and a single arm on the underside of the component lends great rigidity to the mount.

In the lead-frame manufactured in step (a) of the inventive method, the single arm of the second protrusion fits neatly between the two arms of the first protrusion. As a consequence, the lead-frame can be very compact, with relatively little wastage of space. This, in turn, allows the lead-frame to be manufactured with reduced material wastage, and at attendantly reduced cost.

It should be explicitly noted that steps (b) and (c) of the inventive method need not be performed in a fixed order. For example, apart from performing steps (b), (c) and (d) consecutively, it is possible, if so desired, to work in the following order:

perform step (c);
affix face $S_1$ of the component to the two arms of the first protrusion;
perform step (b);
affix face $S_2$ of the component to the single arm of the second protrusion.

Alternatively, one may consecutively perform steps (c) and (b) before positioning the component according to step (d). In any case, all such variants should be interpreted as falling within the scope of the inventive method.

In a preferential embodiment of the inventive method, the lead-frame is manufactured from a thin metallic sheet using a punching procedure. Such a procedure is fast, accurate and relatively cheap, and is compatible with the typical dimensions of a lead-frame (lateral area of the order of 1 cm$^2$, with a thickness of the order of 0.2 mm). In particular, it is easy in this manner to manufacture an entire array of lead-frames, by punching a metallic ribbon at regular spatial intervals. Such an array lends itself to mass-production techniques, since it can easily be fed into a bending and placement machine, with which large numbers of components can be automatically mounted at high speed and with high tolerances.

As an alternative to a punching procedure, it is possible to use a liquid-metallic moulding procedure, for example, though this will generally be more cumbersome.

A further preferential embodiment of the method according to the invention is characterised in that the lead-frame is comprised of at least one metal selected from the group formed by phosphor-bronze, tin, stainless steel, brass, copper-aluminium, and their mixtures. These metals are generally easy to work with in thin-sheet form, since they are relatively soft without being brittle. As a result, they lend themselves to punching and accurate bending. In addition, their melting points are sufficiently high to avoid deformation under typical soldering conditions. Moreover, they are relatively corrosion-resistant, and have satisfactory electrical conductivities.

In a further embodiment of the inventive method, the surfaces of the lead-frame which are parallel to $P_1$ are pre-coated with a layer of solder material. The term "pre-coated" is here intended to imply that coating occurs at some point prior to positioning of the component between the bent protrusions (whether before or after punching, or before or after bending). Coating the said surfaces in this manner allows the component to be rapidly and neatly reflow-soldered to the metallic terminals. The coating can be achieved, for example, by dipping the lead-frame into a bath containing a mixture of molten PbSn-alloy, flux solution and activator, or by brushing, scooping or spraying such a solution over the lead-frame. As an alternative to PbSn, it is possible to use a silver solder, for example.

As an alternative to the embodiment in the preceding paragraph, the metallic terminals can, of course, also be soldered to the faces $S_1$, $S_2$ of the component in a more conventional manner, e.g. with the use of a soldering iron and solder wire. It is then unnecessary to pre-coat the terminals with a layer of solder material. Alternatively, the metallic terminals can be affixed to the faces $S_1$, $S_2$ of the component using a conductive adhesive, though this is generally a more expensive and cumbersome procedure than soldering.

The invention also relates to an electrical component comprising two substantially parallel faces, $S_1$ and $S_2$, to each of which a surface-mountable electrical terminal is affixed, characterised in that each terminal comprises a metallic strip which is divided into two substantially parallel, non-coplanar portions by an interposed step, whereby a first such portion of each terminal is affixed to a component face so as to be substantially parallel thereto whereas the second such portion of each terminal is remote from the component, the second portions of both terminals lying in a single plane $P_0$, whereby the first portion nearest $P_0$ has the form of a single arm, whereas the other first portion is bifurcated into two arms.

Regardless of how its electrical terminals are provided, such a component has definite inventive advantages, e.g. the excellent heat dissipation afforded by the terminal form, the fact that it can bridge underlying conductive tracks on a PCB without attendant short-circuiting, and the considerable rigidity of its mount. As a specific example which does not rely on application of the inventive method, the electrical terminals of the inventive component can be provided by first attaching planar metallic strips to the faces $S_1$ and $S_2$ of the electrical component, and then bending an appropriate step into these strips.

A particularly important embodiment of the component according to the invention is characterised in that it is a ceramic resistor with a positive Temperature Coefficient of Resistivity (PTC resistor). In particular, such an application makes optimal use of the excellent heat dissipative properties inherent to the form of the electrical terminals in the inventive component (which are open, and isolate the component from an underlying PCB).

It should be explicitly noted that all references to the term "PCB" in this text are intended to encompass both circuit boards and foils, whether one-sided or two-sided, flexible or rigid. Such PCBs need not be exclusively dedicated to surface-mounted components, but may also comprise hole-mounted components, or components located outside the board and attached thereto by wires.

BRIEF DESCRIPTION OF THE DRAWINGS

The invention and its attendant advantages will be further elucidated with the aid of exemplary embodiments and the accompanying schematic drawings, not all of uniform scale, whereby.

DETAILED DESCRIPTION

Embodiment 1

FIGS. 1–4 show various aspects of the method, component and lead-frame according to the current invention. Corresponding features in the various Figures are indicated using identical reference symbols.

Figure 1:
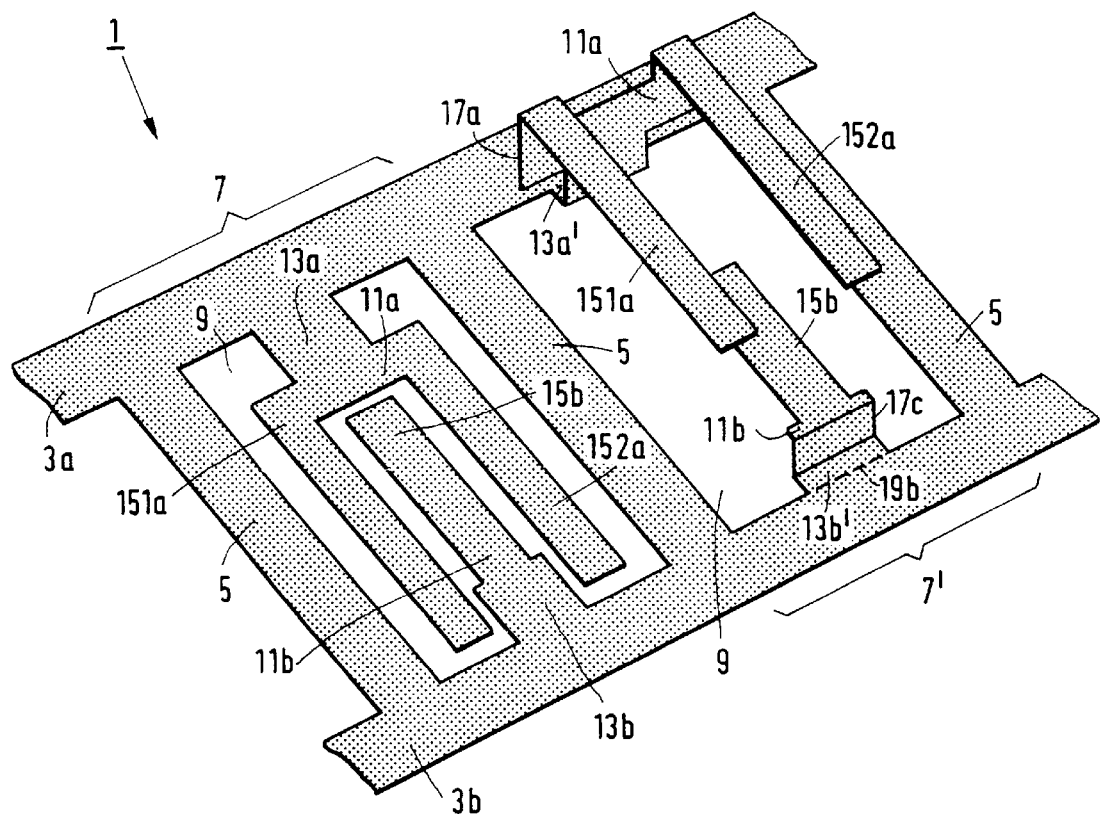
FIG. 1 renders a perspective view of part of an array of lead-frames in accordance with the invention and suitable for application in the inventive method, subsequent to the enaction of a bending procedure on one of the lead-frames.

FIG. 1 renders a perspective view of part of an array 1 of lead-frames in accordance with the invention and suitable for use in the inventive method. The array 1 comprises two substantially parallel metallic strips 3a, 3b which are joined to one another via metallic strips 5 located at regular longitudinal intervals. In this manner, a substantially planar, spatially periodic structure is formed, whose basic repeating units are consecutive lead-frames 7.

In each lead-frame 7, an open area 9 is framed by the strips 3a, 3b and 5. This open area 9 contains coplanar peninsular protrusions 11a, 11b, which emerge from the oppositely-located strips 3a, 3b, respectively. A first protrusion 11a emerges from the strip 3a as a stub 13a, and then bifurcates into two arms 151a, 152a. The second protrusion 11b emerges from the strip 3b as a stub 13b, and then continues as a single arm 15b which extends between the two arms 151a, 152a of the first protrusion 11a.

In a particular embodiment, the strips 3a, 3b, 5 are comprised of a phosphor-bronze alloy (e.g. having an approximate composition 94 at. % Cu, 6 at. % Sn, 0.1 at. % P), and have a sheet thickness of 0.2 mm. The separation of the outer edges of the strips 3a and 3b is 15 mm, and the separation of the centre lines of consecutive strips 5 is 10 mm. The in-plane width of the strips 3a, 3b, 5 is 2 mm, and the in-plane width of the arms 151a, 152a, 15b is 1.6 mm. As here depicted, the in-plane width of the stubs 13a, 13b exceeds that of the arms 151a, 152a, 15b; this, however, is not a necessity, and it is also not necessary that the arms 151a, 152a, 15b be of equal in-plane width, or that they be of uniform width along their lengths, or that the arms 151a, 152a maintain a constant in-plane separation along their lengths.

Also depicted is a lead-frame 7' which has been subjected to steps (b) and (c) of the inventive method. In this lead-frame 7', a step 17b has been bent into the second protrusion 11b, so that a part 13b' of its stub 13b remains within the plane $P_0$ of the array 1, but that (at least) part of its single arm 15b is displaced into a plane $P_2$ which is substantially parallel to $P_0$. In addition, a step 17a has been bent into the first protrusion 11a, so that a part 13a' of its stub 13a remains within $P_1$, but that (at least) part of its two arms 151a, 152a are displaced into a plane $P_1$ which is substantially parallel to $P_0$. The planes $P_0$, $P_1$ and $P_2$ are denoted in FIG. 2.

It should be explicitly noted that the steps 17a, 17b need not be perpendicular to $P_0$, but may also be slanted or curved, for example, or may be comprised of a number of miniature steps.

Figure 2:
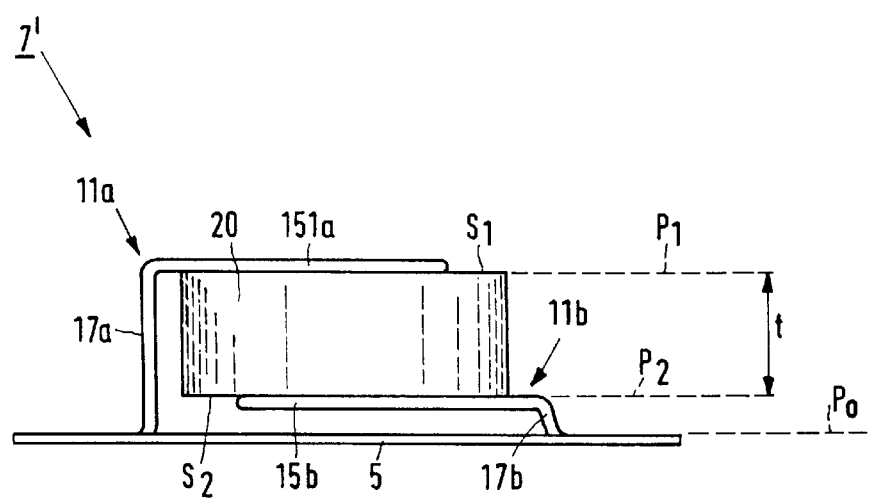
FIG. 2 renders an end view of part of the subject of FIG. 1 subsequent to the positioning therein of an electrical component, in accordance with the inventive method.

FIG. 2 renders an end view of the lead-frame 7' subsequent to the positioning therein of an electrical component 20, in accordance with step (d) of the inventive method. The component 20 is, in this case, circular-cylindrical, and comprises two substantially parallel faces $S_1$, $S_2$ whose perpendicular separation is t (2 mm in the current example).

It is evident from the Figure that the plane $P_1$ into which part of the two arms 151a, 152a have been displaced is more remote from the plane $P_1$ of the strip 5 than is the plane $P_2$ into which part of the single arm 15b has been displaced. By appropriately choosing the height of the steps 17a, 17b, the perpendicular separation of the planes $P_1$ and $P_2$ has been tailored so as to be approximately equal to t. The component 20 therefore fits neatly between the upper arms 151a, 152a and the lower arm 15b, and can be affixed thereto using solder or a conductive adhesive.

In a preferential embodiment of the inventive method, placement of the component 20 is preceded by the application of a layer of solder material to at least those surfaces of the arms 151a, 152a, 15b which will be in contact with the surfaces $S_1$, $S_2$ of the component 20. The component 20 can then be fixed in place using a reflow soldering procedure, whereby the assembly depicted in FIG. 2 is successively subjected to heating (e.g. in an oven) and cooling, so as to melt and subsequently re-solidify the said layer of solder material, thereby soldering the component 20 in place. The required layer of solder material can be applied, for example, by brushing both the topside and the underside of the entire array 1 with molten solder solution.

Figure 3:
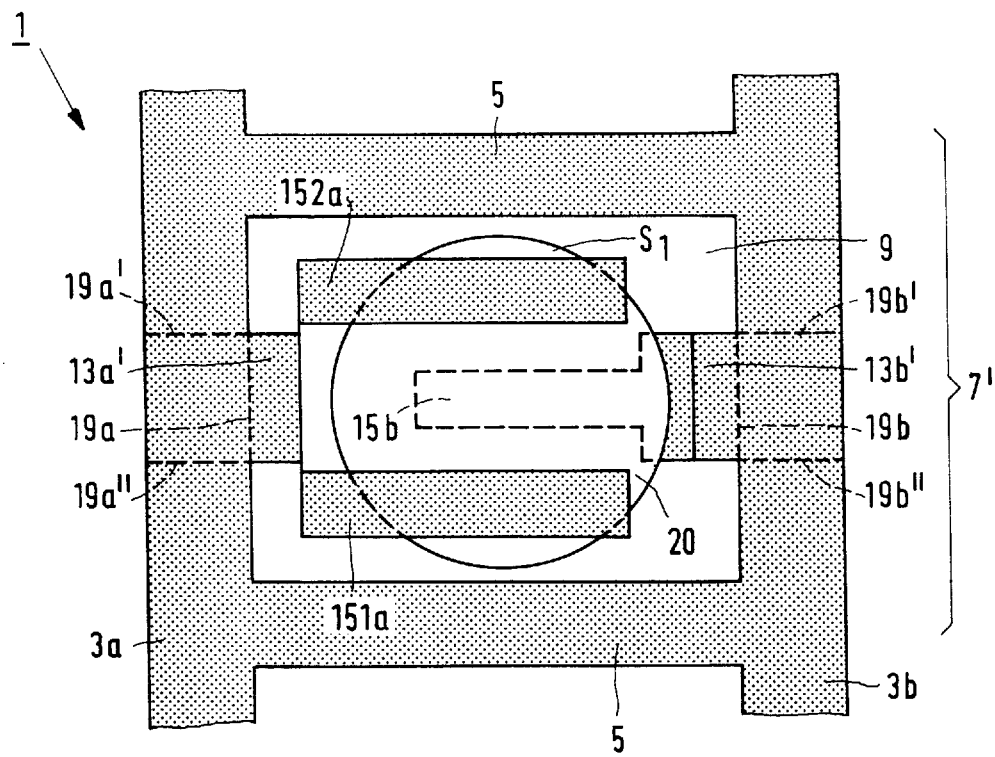
FIG. 3 is a plan view of the subject of FIG. 2.

FIG. 3 is a plan view of the subject of FIG. 2. As here depicted, the diameter of the face $S_1$ of component 20 exceeds the separation of the arms 151a, 152a. However, this is not a necessity, and the said diameter may also be smaller or larger than that shown.

Once the component 20 has been affixed to the arms 151a, 152a, 15b, the in-plane stub parts 13a', 13b' of the protrusions 11a, 11b can be separated from the lead-frame 7'. This can be achieved, for example, by chopping along the dashed lines 19a, 19b. Alternatively, one may chop, for example, along the lines 19a', 19a" and 19b', 19b".

Figure 4:
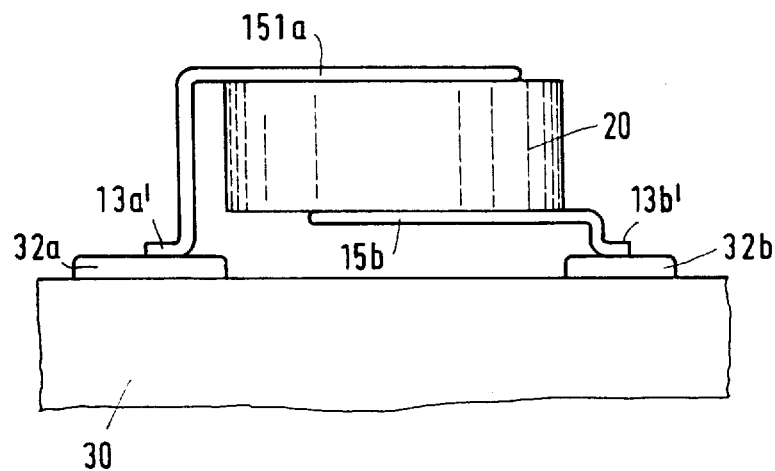
FIG. 4 shows the subject of FIG. 2 subsequent to its separation from the lead-frame and its mounting on a pair of lands on a printed circuit board.

FIG. 4 shows the subject of FIG. 2 subsequent to its separation from the lead-frame 7' and to its mounting on a pair of lands 32a, 32b on a printed circuit board 30. Such mounting can be performed using a reflow soldering technique, or using conventional soldering. In the case of the former, the underside of the in-plane stub parts 13a', 13b' will already have the required coating of solder material if the array 1 was pre-coated with solder prior to positioning of the component 20.

Embodiment 2

In an embodiment otherwise identical to Embodiment 1, the arms 151a, 152a, 15b extend parallel to the plane $P_0$, but are not flat. Instead, they each present a gently convex surface to the face of the component 20 with which they are in contact.

Embodiment 3

In an embodiment otherwise identical to Embodiment 1 or 2, the electrical component 20 does not have the form of a circular cylinder. Instead, it may have the form of, for example, a square tablet, a rectanguloid, a parallelepiped, or a disc with slightly domed circular faces, among many other possibilities.

Embodiment 4

In an embodiment otherwise identical to Embodiment 1, 2 or 3, the parts 13a', 13b' of the respective stubs 13a, 13b are bent inwards through 180° after enaction of step (e), so that the surface-mounted component 20 will occupy less horizontal space on the PCB 30.

What is claimed is:

1. A method of providing an electrical component with surface-mountable metallic terminals, the component comprising two substantially parallel faces, $S_1$ and $S_2$, that support first and second electrical contacts, respectively, of the component, the separation of these faces along an axis perpendicular to the faces having a value t, comprising the following steps:

(a) providing a substantially planar lead-frame in which an open area is framed by metallic strips defining a plane $P_1$, the open area containing a first and a second peninsular protrusion which emerge from oppositely located strips, the first protrusion emerging as a stub and then bifurcating into two arms, the second protrusion emerging as a stub and then continuing as a single arm which extends between the two arms of the first protrusion;

(b) bending an offset portion into the second protrusion, so that part of its stub remains within the plane $P_0$ of the strips but that part of its single arm is displaced into a plane $P_2$ substantially parallel to $P_0$;

(c) bending an offset portion into the first protrusion, so that part of its stub remains within the plane $P_0$ of the strips but that part of each of the two arms is displaced into a plane $P_1$ substantially parallel to $P_0$, whereby $P_2$ is located between $P_0$ and $P_1$ and the separation of $P_1$ and $P_2$ along an axis perpendicular to $P_1$ and $P_2$ is approximately equal to t;

(d) fixing the component between the planes $P_1$ and $P_2$ so that the two arms of the first protrusion are affixed to face $S_1$ and the single arm of the second protrusion is affixed to face $S_2$, electrical contact being made between the two arms of the first protrusion and the first electrical contact supported by face $S_1$ and electrical contact being made between the single arm of the second protrusion and the second electrical contact supported by face $S_2$;

(e) cutting the stubs of each of the first and second protrusions away from the adjoining strips.

2. The method according to claim 1, wherein the lead-frame is manufactured from a thin metallic sheet using a punching procedure.

3. The method according to claim 2, wherein the lead-frame is comprised of at least one metal selected from the group formed by phosphor-bronze, tin, stainless steel, brass, copper-aluminium, and composites thereof.

4. The method according to claim 2, wherein the surfaces of the lead-frame which are parallel to $P_0$ are pre-coated with a layer of solder material.

5. The method according to claim 1, wherein the lead-frame is comprised of at least one metal selected from the group formed by phosphor-bronze, tin, stainless steel, brass, copper-aluminium, and composites thereof.

6. A method according to claim 5, wherein the surfaces of the lead-frame which are parallel to $P_0$ are pre-coated with a layer of solder material.

7. The method according to claim 1, wherein the surfaces of the lead-frame which are parallel to $P_0$ are pre-coated with a layer of solder material.

* * * * *